US008412849B2

(12) United States Patent
Lesko et al.

(10) Patent No.: US 8,412,849 B2
(45) Date of Patent: Apr. 2, 2013

(54) SYSTEMS AND METHODS FOR LOSSLESS COMPRESSION OF DATA AND HIGH SPEED MANIPULATION THEREOF

(75) Inventors: Joseph Lesko, Glendale, AZ (US); John G McDonald, Eugene, OR (US)

(73) Assignee: American Express Travel Related Services Company, Inc., New York, NY (US)

( * ) Notice: Subject to any disclaimer, the term of this patent is extended or adjusted under 35 U.S.C. 154(b) by 180 days.

(21) Appl. No.: 13/095,679

(22) Filed: Apr. 27, 2011

(65) Prior Publication Data
US 2012/0278506 A1    Nov. 1, 2012

(51) Int. Cl.
G06F 15/16    (2006.01)
(52) U.S. Cl. ............ 709/247; 726/26; 726/32; 707/101; 707/205
(58) Field of Classification Search .................. 709/223, 709/228, 247; 726/26, 32; 707/101, 205; 341/50
See application file for complete search history.

(56) References Cited

U.S. PATENT DOCUMENTS

| | | | |
|---|---|---|---|
| 2002/0196167 | A1 | 12/2002 | Sun |
| 2005/0268341 | A1* | 12/2005 | Ross ............................. 726/26 |
| 2007/0109155 | A1 | 5/2007 | Fallon |
| 2007/0223823 | A1* | 9/2007 | Islam et al. .................. 382/232 |
| 2009/0113076 | A1* | 4/2009 | Long ............................. 709/248 |
| 2009/0319549 | A1* | 12/2009 | Millett ......................... 707/101 |

OTHER PUBLICATIONS

International Search Report and Written Opinion dated Jul. 13, 2012 in Application No. PCT/US2012/035406.

* cited by examiner

*Primary Examiner* — Wing F. Chan
*Assistant Examiner* — Hitesh Patel
(74) *Attorney, Agent, or Firm* — Snell & Wilmer L.L.P.

(57) ABSTRACT

The present disclosure includes a system, method, and article of manufacture for lossless compression of data and high speed manipulation thereof. The method may comprise associating one or more of a plurality of unique entities with one or more of a plurality of unique binary numbers; associating a collection with the plurality of unique entities; and determining that the collection includes one of the plurality of unique entities based upon the unique binary number associated with the unique entity. The associating the collection with the plurality of unique entities may further comprise summing the unique binary numbers associated with the plurality of unique entities, and/or associating the collection with a binary number that is a logical result of a bitwise operation between unique binary numbers associated with the plurality of unique entities.

17 Claims, 7 Drawing Sheets

Figure 3

| Entity Cross-Reference Table |||
|---|---|---|
| Entity | Base_10 | Binary |
| A | 1 | 000001 |
| B | 2 | 000010 |
| C | 4 | 000100 |
| D | 8 | 001000 |
| E | 16 | 010000 |
| F | 32 | 100000 |

Figure 4

| Collections Table |||
|---|---|---|
| Collection | Base_10 | Binary |
| C1 | 15 | 001111 |
| C2 | 7 | 000111 |
| C3 | 19 | 010011 |
| C4 | 32 | 100000 |
| C5 | 7 | 000111 |

Figure 5

| Monthly Summary Table |||||
|---|---|---|---|---|
| Collection | Day_1 | Day_2 | ... | Day_M |
| C1 | 0001011011010 | 011111111000 | ... | 0111011011001 |
| C2 | 0001011110100 | 011101100111 | ... | 0011111011110 |
| C3 | 1110110110100 | 111011011000 | ... | 1101001111000 |
| C4 | 0010111101011 | 101011001001 | ... | 0000000011110 |
| C5 | 0101010101010 | 001101001110 | ... | 1100111111011 |

Figure 6

| Summary Collections Table |||
|---|---|---|
| Collection | Used | Assigned |
| C1 | 11011011101 | 00010001001 |
| C2 | 00110011111 | 00110011111 |
| C3 | 11110111000 | 11110110000 |
| C4 | 11011011110 | 11011111100 |
| C5 | 11011000010 | 01101100001 |

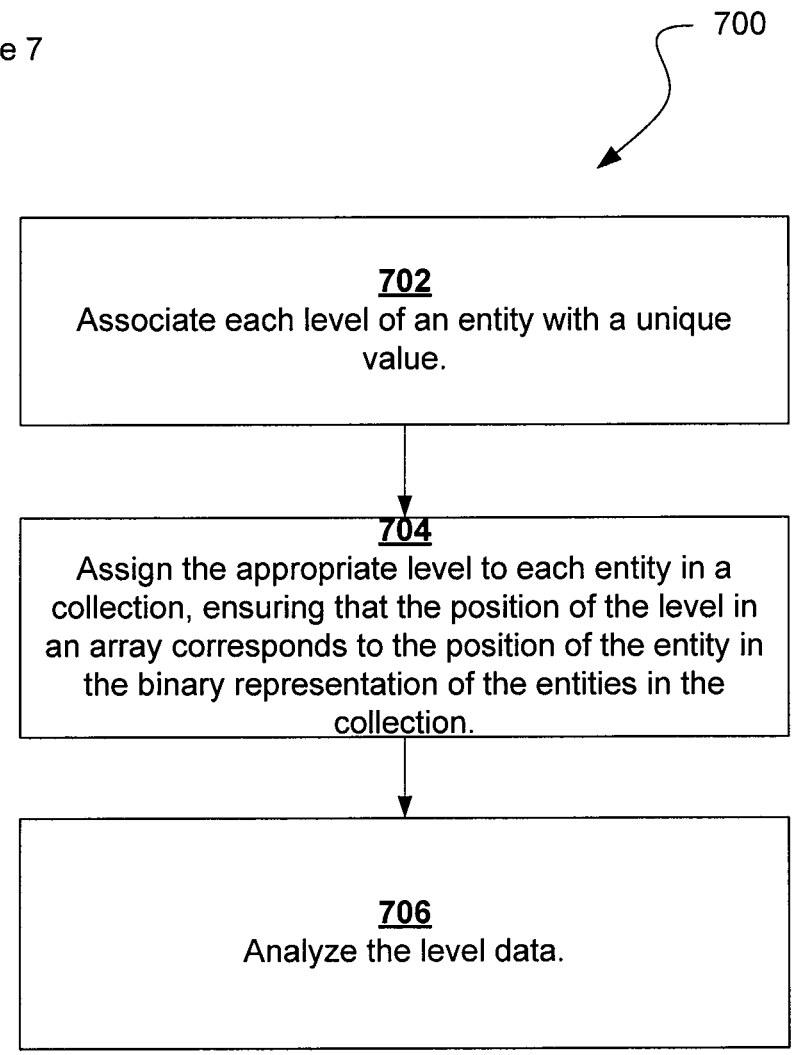

Figure 8A

| Level Cross-Reference Table | |
|---|---|
| Level | Unique Value |
| Level_1 | 1 |
| Level_2 | 2 |
| Level_3 | 3 |
| Level_4 | 4 |
| Level_5 | 5 |
| Level_6 | 6 |

Figure 8B

| Level Cross-Reference Table | |
|---|---|
| Level | Unique Value |
| None attempted and none granted | 00 |
| Read attempted and read denied | 01 |
| Read attempted and read granted | 11 |
| Write attempted and write denied | 02 |
| Write attempted and write granted | 12 |

Figure 9

| Level Data Collections Table | |
|---|---|
| Collection | Level Data Array |
| C1 | 0\|0\|3\|5\|0\|2 |
| C2 | 2\|0\|0\|3\|3\|1 |
| C3 | 5\|0\|0\|0\|2\|5 |
| C4 | 1\|0\|0\|1\|2\|2 |
| C5 | 3\|3\|2\|2\|1\|2 |

Figure 10

| Monthly Level Data Collections Table |||||
|---|---|---|---|---|
| Collection | Day_1 | Day_2 | ... | Day_M |
| C1 | 0\|0\|3\|5\|0\|2 | 2\|2\|2\|3\|2\|5 | ... | 3\|3\|2\|5\|5\|5 |
| C2 | 2\|0\|0\|3\|3\|1 | 1\|1\|5\|2\|3\|4 | ... | 1\|2\|1\|2\|1\|2 |
| C3 | 5\|0\|0\|0\|2\|5 | 2\|2\|5\|5\|4\|2 | ... | 3\|2\|3\|5\|5\|4 |
| C4 | 1\|0\|0\|1\|2\|2 | 1\|1\|1\|2\|5\|5 | ... | 2\|2\|3\|4\|4\|4 |
| C5 | 3\|3\|2\|2\|1\|2 | 3\|3\|2\|3\|3\|2 | ... | 5\|5\|5\|1\|1\|4 |

Figure 11

| Summary Level Data Collections Table ||
|---|---|
| Collection | Maximum Levels for Month |
| C1 | 5\|3\|3\|5\|4\|5 |
| C2 | 3\|3\|5\|5\|4\|5 |
| C3 | 5\|3\|5\|5\|3\|5 |
| C4 | 2\|3\|3\|5\|5\|2 |
| C5 | 3\|3\|4\|5\|2\|5 |

Figure 12

| Risk Level Cross-Reference Table ||
|---|---|
| Level | Unique Value |
| Risk_Level_1 | 1 |
| Risk_Level_2 | 2 |
| Risk_Level_3 | 3 |
| Risk_Level_4 | 4 |
| Risk_Level_5 | 5 |
| Risk_Level_6 | 6 |
| Risk_Level_7 | 7 |
| Risk_Level_8 | 8 |
| Risk_Level_9 | 9 |

Figure 13

| Risk Level Data Collections Table | |
|---|---|
| Collection | Level Data Array |
| C1 | 1\|1\|2\|1\|5\|1 |
| C2 | 9\|2\|1\|3\|2\|2 |
| C3 | 2\|2\|1\|5\|1\|3 |
| C4 | 1\|1\|2\|1\|3\|6 |
| C5 | 2\|2\|5\|7\|8\|3 |

Figure 14

| Monthly Risk Level Transaction Count Table | | | | |
|---|---|---|---|---|
| Collection | Day_1 | Day_2 | ... | Day_M |
| C1 | 22\|10\|46\|80\|99\|22 | 29\|29\|27\|93\|62\|59 | ... | 93\|34\|28\|54\|53\|58 |
| C2 | 73\|97\|90\|83\|73\|91 | 17\|17\|57\|27\|39\|44 | ... | 19\|29\|12\|21\|99\|24 |
| C3 | 51\|40\|50\|60\|92\|95 | 27\|72\|75\|56\|45\|21 | ... | 73\|72\|83\|95\|55\|84 |
| C4 | 91\|70\|50\|81\|92\|72 | 19\|11\|15\|24\|55\|59 | ... | 27\|92\|53\|54\|44\|74 |
| C5 | 93\|73\|82\|62\|81\|72 | 37\|31\|22\|39\|37\|27 | ... | 95\|45\|85\|51\|61\|74 |

SYSTEMS AND METHODS FOR LOSSLESS COMPRESSION OF DATA AND HIGH SPEED MANIPULATION THEREOF

BACKGROUND

1. Field

The present disclosure generally relates to compression of data, and more particularly, to lossless compression of data and high speed manipulation thereof.

2. Related Art

There are many instances in which it is advantageous to inquire into the activity and/or attributes associated with a particular individual (e.g., a computer user). For example, many organizations sometimes go to great expense to remain apprised of the network activities of their employees. That is, a large number of organizations often expend a large amount of money and time determining to which websites/domains their employees surf (an activity), which network permissions their employees may be assigned (an attribute), and the like. In the past, these activities/attributes have typically been tracked by keeping a database of each website/domain an employee/individual visits and/or a database of each permission assigned to each employee/individual. Thus, for a large number of employees/individuals surfing to a large number of websites/domains, or a large number of employees/individuals associated with a particular permission or group of permissions (only some of which may be necessary for the performance of the employee's/individual's assignments), the processing and memory requirements escalate rapidly. As such, organizations attempting to inquire into the activities/attributes associated with their employees have spent a large amount of money to perform such tasks.

Accordingly, what is needed is a technique for rapidly and inexpensively compressing and manipulating the large amount of data that may comprise an employee's/individual's activity or attributes on or within a network, such that the memory and processing requirements which have heretofore been necessary in the pursuit of these inquiries are substantially allayed, if not obviated altogether.

SUMMARY

The present disclosure includes a system, method, and article of manufacture for lossless (or almost lossless) compression of data and high speed manipulation thereof. The method may comprise associating a plurality of entities with a plurality of unique binary numbers; associating a collection with the plurality of entities; and determining that the collection includes one of the plurality of entities based upon the unique binary number associated with the entity. In an embodiment, associating the collection with the plurality of entities may further comprise summing the unique binary numbers associated with the plurality of entities, and/or associating the collection with a binary number that is a logical result of a bitwise operation between unique binary numbers associated with the plurality of entities Further, the method may comprise comparing, with a bitwise operator, a first binary number associated with a first collection to a second binary number associated with a second collection, and/or comparing a binary number associated with the collection to at least one of the plurality of unique binary numbers associated with the plurality of entities. A unique binary number may correspond to a base 10 number of the form $2^{(n-1)}$, e.g., 000001, 000010, 000100, etc. Further still, a most frequently occurring entity may be associated with a binary number corresponding to a base 10 value of $2^0$, and based upon a frequency of occurrence, less frequently occurring entities may be associated with binary numbers corresponding to increasing powers of the number two In an embodiment, the method may further comprise associating level data with the plurality of entities. Level data may be associated with a same bit position that an entity occupies in a given collection. Further, a pseudo-real time trending analysis may be performed based upon at least one of the plurality of entities associated with the collection and level data for each of the plurality of entities associated with the collection. The method may further comprise determining that the collection may comprise an entity that is included in another collection, and relocating the entity from the collection to the other collection based upon the determining.

BRIEF DESCRIPTION OF THE DRAWINGS

The features and advantages of the present disclosure will become more apparent from the detailed description set forth below when taken in conjunction with the drawings. The left-most digit of a reference number identifies the drawing in which the reference number first appears.

FIG. 3 shows an exemplary entity cross-reference table.

FIG. 4 shows an exemplary collections table, with the binary representation showing the entities included in each collection.

FIG. 5 shows an exemplary monthly summary table for some period of time, e.g., days of the month, and the associated entities for each collection.

FIG. 6 shows an exemplary summary collections table including used and assigned entity data.

FIG. 7 shows a flowchart depicting an exemplary process for associating an entity with level data.

FIG. 8A shows an exemplary level cross-reference table.

FIG. 8B shows an exemplary level cross-reference table.

FIG. 9 shows an exemplary level data collections table.

FIG. 10 shows an exemplary monthly level data collections table for some period of time, e.g., days of the month.

FIG. 11 shows an exemplary summary level data collections table with the maximum values that occurred during the given period of time.

FIG. 12 shows an exemplary risk level cross-reference table.

FIG. 13 shows an exemplary risk level data collections table.

FIG. 14 shows an exemplary risk level transaction count table, where the $n^{th}$ array element holds the associated count for the $n^{th}$ entity in the binary representation of the entities in the collection.

DETAILED DESCRIPTION

Figure 1:
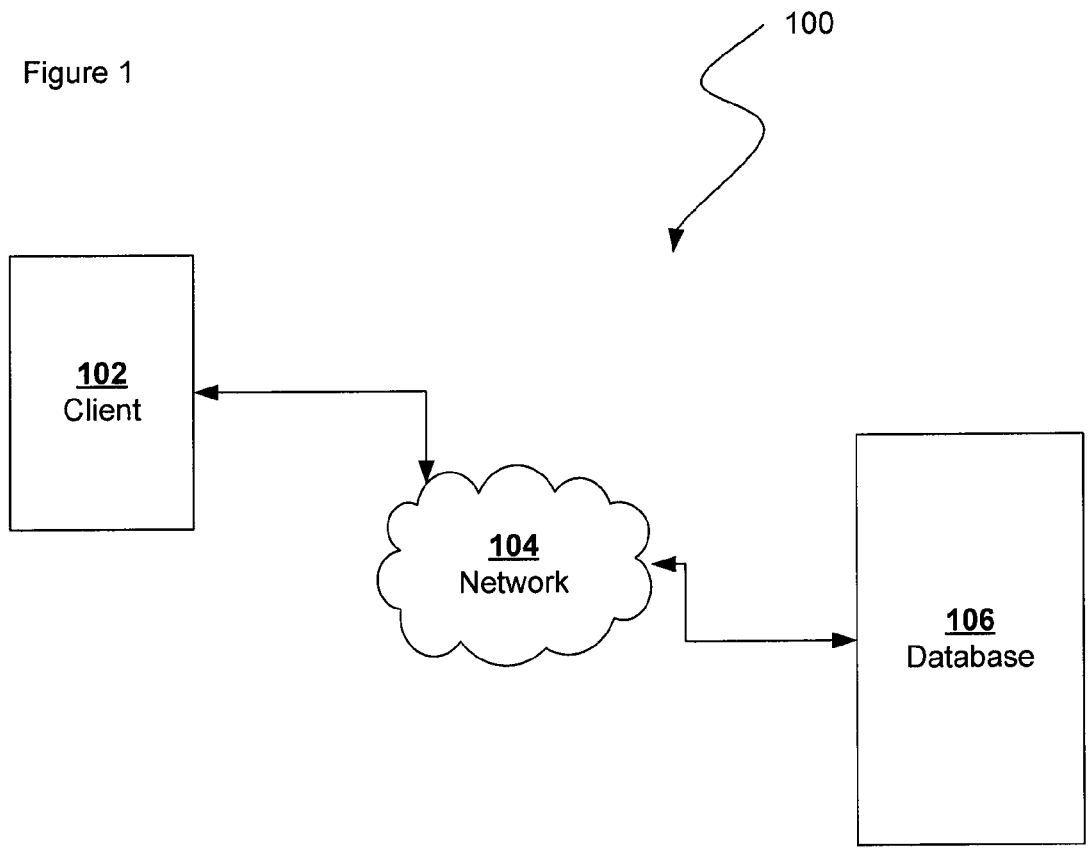
FIG. 1 shows an exemplary system diagram in accordance with an embodiment.

The detailed description of exemplary embodiments herein makes reference to the accompanying drawings, which show the exemplary embodiments by way of illustration and their best mode. While these exemplary embodiments are described in sufficient detail to enable those skilled in the art to practice the disclosure, it should be understood that other embodiments may be realized and that logical and mechanical changes may be made without departing from the spirit and scope of the disclosure. Thus, the detailed description herein is presented for purposes of illustration only and not of limitation. For example, the steps recited in any of the method or process descriptions may be executed in any order and are not limited to the order presented. Moreover, any of the functions or steps may be outsourced to or performed by one or more third parties. Furthermore, any reference to singular includes plural embodiments, and any reference to more than one component may include a singular embodiment.

Phrases and terms similar to "financial institution," "transaction account issuer," and "payment processor" may include any person, entity, software and/or hardware that offers transaction account services. Although often referred to as a "financial institution," the financial institution may represent any type of bank, lender or other type of account issuing institution, such as credit card companies, card sponsoring companies, or third party issuers under contract with financial institutions. It is further noted that other participants may be involved in some phases of the transaction, such as an intermediary settlement institution.

Phrases and terms similar to "business", "merchant", "supplier" or "seller" may be used interchangeably with each other and shall mean any person, entity, distributor system, software and/or hardware that is a provider, broker and/or any other entity in the distribution chain of goods or services and/or that receives payment or other consideration. For example, a merchant may be a grocery store, a retail store, a travel agency, a service provider, an on-line merchant or the like. For example, a supplier may request payment for goods sold to a buyer who holds an account with a transaction account issuer.

The terms "payment vehicle," "financial transaction instrument," "transaction instrument," or "transaction account product" may be used interchangeably throughout to refer to a financial instrument. As used herein, an account code may or may not be associated with a physical financial instrument.

Phrases and terms similar to a "buyer," "participant", "consumer," and "user" may include any person, entity, software and/or hardware that receives items in exchange for consideration (e.g. financial payment). For example, a buyer may purchase, lease, rent, barter or otherwise obtain items from a supplier and pay the supplier using a transaction account.

Phrases and terms similar to an "item" may include any good, service, information, experience, data, content, access, rental, lease, contribution, account, credit, debit, benefit, right, reward, points, coupons, credits, monetary equivalent, anything of value, something of minimal or no value, monetary value, non-monetary value and/or the like.

Phrases or terms similar to a "payment processor" may include a company (e.g., a third party) appointed (e.g., by a merchant) to handle transactions for merchant banks. Processors may be broken down into two types: front-end and back-end. Front-end processors have connections to various transaction accounts and supply authorization and settlement services to the merchant banks' merchants. Back-end processors accept settlements from front-end processors and, via The Federal Reserve Bank, move money from an issuing bank to the merchant bank. In an operation that will usually take a few seconds, the payment processor will both check the details received by forwarding the details to the respective account's issuing bank or card association for verification, and may carry out a series of anti-fraud measures against the transaction. Additional parameters, including the account's country of issue and its previous payment history, may be used to gauge the probability of the transaction being approved. In response to the payment processor receiving confirmation that the transaction account details have been verified, the information may be relayed back to the merchant, who will then complete the payment transaction. In response to the verification being denied, the payment processor relays the information to the merchant, who may then decline the transaction.

Phrases or terms similar to a "payment gateway" or "gateway" may include an application service provider that authorizes payments for e-businesses, online retailers, and/or traditional brick and mortar merchants. A payment gateway may protect transaction account details by encrypting sensitive information, such as transaction account numbers, to ensure that information passes securely between the customer and the merchant and also between merchant and payment processor.

As used herein, "transmit" may include sending electronic data from one system component to another over a network connection. Additionally, as used herein, "data" may include encompassing information such as commands, queries, files, data for storage, and the like in digital or any other form.

As used herein, "issue a debit", "debit" or "debiting" refers to either causing the debiting of a stored value or prepaid card-type financial account, or causing the charging of a credit or charge card-type financial account, as applicable.

Phrases or terms similar to "transaction account" may include any account that may be used to facilitate a financial transaction. A "transaction account" as used herein refers to an account associated with an open account or a closed account system (as described herein). The transaction account may exist in a physical or non-physical embodiment. For example, a transaction account may be distributed in non-physical embodiments such as an account number, frequent-flyer account, and telephone calling account or the like. Furthermore, a physical embodiment of a transaction account may be distributed as a financial instrument.

In general, transaction accounts may be used for transactions between the user and merchant through any suitable communication means, such as, for example, a telephone network, intranet, the global, public Internet, a point of interaction device (e.g., a point of sale (POS) device, personal digital assistant (PDA), mobile telephone, kiosk, etc.), online communications, off-line communications, wireless communications, and/or the like.

An "account", "account code", or "account number", as used herein, may include any device, code, number, letter, symbol, digital certificate, smart chip, digital signal, analog signal, biometric or other identifier/indicia suitably configured to allow the consumer to access, interact with or communicate with the system (e.g., one or more of an authorization/access code, personal identification number (PIN), Internet code, other identification code, and/or the like). The account number may optionally be located on or associated with a rewards card, charge card, credit card, debit card, prepaid card, telephone card, embossed card, smart card, magnetic stripe card, bar code card, transponder, radio frequency card or an associated account. The system may include or interface with any of the foregoing cards or devices, or a transponder and RFID reader in RF communication with the transponder (which may include a fob). Typical devices may include, for example, a key ring, tag, card, cell phone, wristwatch or any such form capable of being presented for interrogation. Moreover, the system, computing unit or device discussed herein may include a "pervasive computing device," which may include a traditionally non-computerized device that is embedded with a computing unit. Examples can include watches, Internet enabled kitchen appliances, restaurant tables embedded with RF readers, wallets or purses with imbedded transponders, etc.

The account code may be distributed and stored in any form of plastic, electronic, magnetic, radio frequency, wireless, audio and/or optical device capable of transmitting or downloading data from itself to a second device. A customer account code may be, for example, a sixteen-digit transaction account code, although each transaction account provider has its own numbering system, such as the fifteen-digit numbering system used by American Express. Each company's transaction account codes comply with that company's standardized format such that the company using a fifteen-digit format will generally use three-spaced sets of numbers, as represented by the number "0000 000000 00000". The first five to seven digits are reserved for processing purposes and identify the issuing bank, card type, etc. In this example, the last (fifteenth) digit is used as a sum check for the fifteen digit number. The intermediary eight-to-eleven digits are used to uniquely identify the customer. A merchant account code may be, for example, any number or alpha-numeric characters that identify a particular merchant for purposes of card acceptance, account reconciliation, reporting, or the like.

It should be noted that the transfer of information in accordance with the present disclosure, may be completed in a format recognizable by a merchant system or account issuer. In that regard, by way of example, the information may be transmitted from an RFID device to an RFID reader or from the RFID reader to the merchant system in magnetic stripe or multi-track magnetic stripe format.

In one exemplary embodiment, a system, method and/or computer program product for lossless compression of data. Furthermore, the data may be manipulated in a compressed state very efficiently and at high speed.

Referring to FIG. 1, an exemplary system 100 for lossless compression and high-speed efficient manipulation of data is disclosed. System 100 may comprise a client 102, a network 104, and/or a database 106. In an exemplary embodiment, system 100 may comprise a mainframe system (not shown) and/or a single distributed system (not shown).

Client 102 may include a variety of devices (e.g., a personal computer, including those discussed herein. A client may communicate via network 104. A client may comprise a variety of browsing software or browser applications (e.g., Microsoft Internet Explorer, Mozilla Firefox, Google Chrome, Apple Safari, or any other of the myriad software packages available for browsing the internet). Such browser applications may comprise Internet browsing software installed within a computing unit or a system to conduct online transactions and/or communications. These computing units or systems may take the form of a computer or processor, or a set of computers/processors, although other types of computing units or systems may be used, including laptops, notebooks, hand held computers, personal digital assistants, cellular phones, smart phones (e.g., iPhone®, BlackBerry®, Droid®, etc.) set-top boxes, workstations, computer-servers, main frame computers, mini-computers, PC servers, pervasive computers, network sets of computers, personal computers, such as iPads®, iMACs®, and MacBooks®, kiosks, terminals, point of sale (POS) devices and/or terminals, televisions, or any other device capable of receiving data over a network.

As those skilled in the art will appreciate, a client may include an operating system (e.g., Windows NT, 95/98/2000/CE/Mobile/XP/Vista/Windows 7, OS2, UNIX, Linux, Solaris, MacOS, PalmOS, etc.) as well as various conventional support software and drivers typically associated with computers. A client may implement security protocols such as Secure Sockets Layer (SSL) and Transport Layer Security (TLS). A client may implement one or more application layer protocols, including, for example, http, https, ftp, and sftp. Transactions originating at a client may pass through a firewall (not shown; see below) in order to prevent unauthorized access from users of other networks.

Network 104 may comprise any cloud, cloud computing system or electronic communications system or method which incorporates software and/or hardware components. Communication may be accomplished through any suitable communication channels, such as, for example, a telephone network, an extranet, an intranet, Internet, point of interaction device (point of sale device, personal digital assistant, smart phone, cellular phone (e.g., iPhone®, Palm Pilot®, Blackberry®), kiosk, etc.), online communications, satellite communications, off-line communications, wireless communications, transponder communications, local area network (LAN), wide area network (WAN), virtual private network (VPN), networked or linked devices, keyboard, mouse and/or any suitable communication or data input modality. Moreover, although network 104 may be described herein as being implemented with TCP/IP communications protocols, the network 104 may also be implemented using IPX, Appletalk, IP-6, NetBIOS, OSI, any tunneling protocol (e.g. IPsec, SSH), or any number of existing or future protocols. If the network 104 is in the nature of a public network, such as the Internet, it may be advantageous to presume the network 104 to be insecure and open to eavesdroppers. Specific information related to the protocols, standards, and application software utilized in connection with the Internet is generally known to those skilled in the art and, as such, need not be detailed herein. See, for example, DILIP NAIK, INTERNET STANDARDS AND PROTOCOLS (1998); JAVA 2 COMPLETE, various authors, (Sybex 1999); DEBORAH RAY AND ERIC RAY, MASTERING HTML 4.0 (1997); and LOSHIN, TCP/IP CLEARLY EXPLAINED (1997) and DAVID GOURLEY AND BRIAN TOTTY, HTTP, THE DEFINITIVE GUIDE (2002), the contents of which are hereby incorporated by reference. In an embodiment, a network 104 may be excluded from system 100. More particularly, system 100 may comprise a mainframe system and/or a single distributed system The various system components described herein may be independently, separately or collectively coupled to the network 104 via one or more data links including, for example, a connection to an Internet Service Provider (ISP) over a local loop as is typically used in connection with standard modem communication, cable modem, Dish networks, ISDN, Digital Subscriber Line (DSL), or various wireless communication methods, see, e.g., GILBERT HELD, UNDERSTANDING DATA COMMUNICATIONS (1996), which is hereby incorporated by reference. It is noted that the network 104 may be implemented variously. For example, network 104 may be implemented as an interactive television (ITV) network. The systems and methods disclosed herein contemplate the use, sale and/or distribution of any goods, services or information over any network having functionality similar to that described above with reference to network 104.

"Cloud" or "Cloud computing" includes a model for enabling convenient, on-demand network access to a shared pool of configurable computing resources (e.g., networks, servers, storage, applications, and services) that can be rapidly provisioned and released with minimal management effort or service provider interaction. Cloud computing may include location-independent computing, whereby shared servers provide resources, software, and data to computers and other devices on demand. For more information regarding cloud computing, see the NIST's (National Institute of Standards and Technology) definition of cloud computing at http://csrc.nist.gov/groups/SNS/cloud-computing/cloud-def-v15.doc (last visited Feb. 4, 2011), which is hereby incorporated by reference in its entirety.

Database 106 may comprise any type of hardware and/or software (e.g., a computer server) configured or configurable to host a database. Typically, such a server comprises a rack mountable server appliance running a suitable database server (e.g., SQL Server 2008, an Oracle database, and the like), and/or one or more virtual machines.

Figure 2:
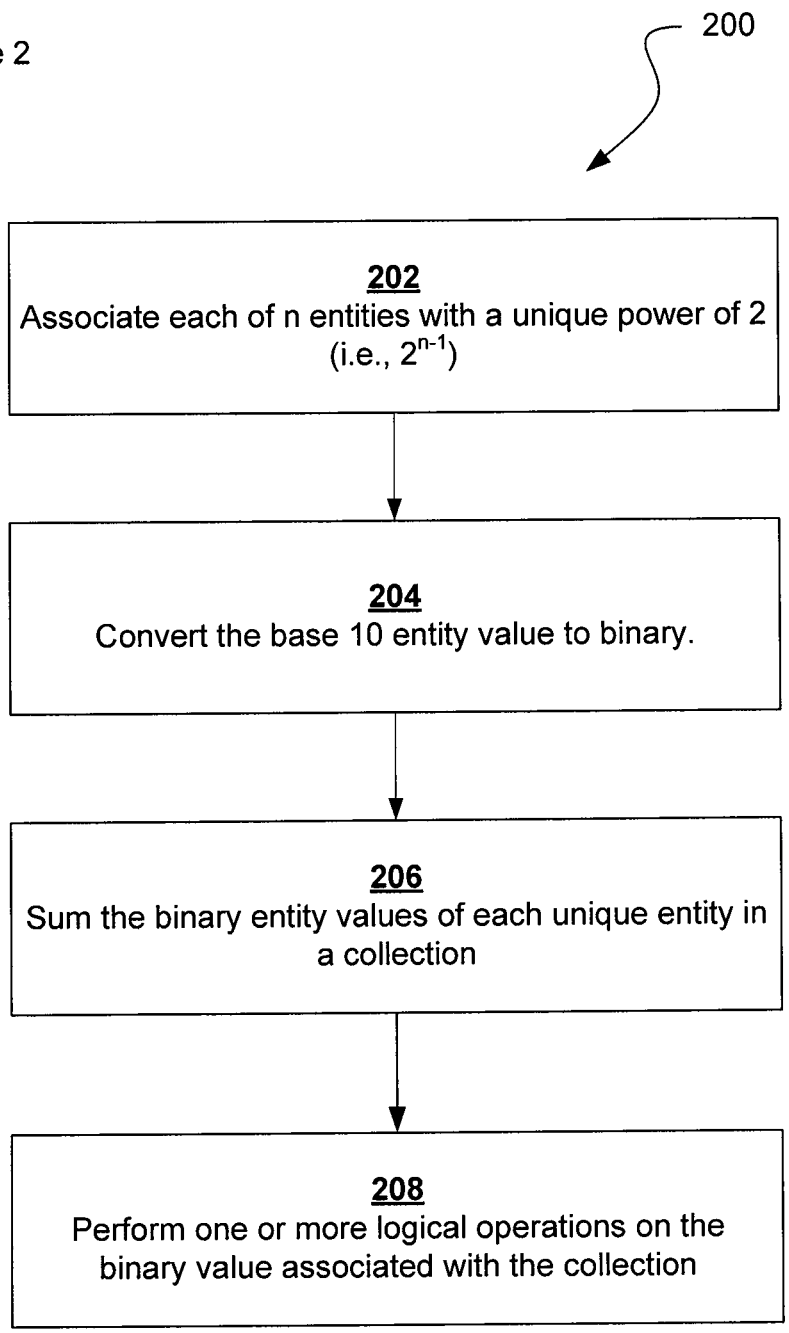
FIG. 2 shows a flowchart depicting an exemplary process for associating entities and collections with binary numbers.

With reference to FIG. 2, an exemplary process 200 for lossless compression and efficient manipulation of data is disclosed. As a primer, the following definitions apply.

Broadly, a "collection" may comprise a group or cluster of "entities," and an "entity" may comprise any element, part, or aspect of a collection. To clarify, although the foregoing definitions are not so limited, an entity may comprise any transaction, activity, occurrence, event, system, user, and/or attribute that may be associated with a collection, and a collection may comprise any group or cluster of transactions, activities, occurrences, events, systems, users and/or attributes. Moreover, a collection may in one instance operate as an entity, and an entity, likewise, as a collection.

Take, for example, a collection comprising a user (a "user collection"). A variety of entities may be associated with the user collection; but, to take a single entity for purposes of illustration, a variety of transaction entities (e.g., visits to a website/domain or file access attempts) may be associated with the user collection. Thus, the user may comprise a collection of transaction entities. More particularly, in this case, the user collection may comprise one or more visits by the user to a website/domain or accesses by the user of a file.

However, and as mentioned above, a collection may in one instance operate as an entity, and the entity a collection. For example, a transaction entity (e.g., a website or a file) may operate as a collection, while a user may operate as an entity that accesses the website/file collection. Thus, in this example, the website or file may comprise a collection of user entities which have accessed the website or file collection.

Thus, the terms "entity" and "collection" may be, at the most basic level, defined by their relationship to one another. In other words, because a user may comprise a collection in one scenario, but an entity in another scenario, it is helpful to realize that the terms are best understood as a one-to-one, one-to-many, or many-to-many relationship between two interrelated data sets or elements.

Accordingly, and for purposes of illustration, several examples of collection-entity relationships are provided. In an embodiment, an entity may comprise one or more transactions, users, user activities, internet sites, internet proxy activities, systems, alerts from systems or processes, anti-virus activities, data leakage prevention events, system activities, and the like. Likewise, a collection may comprise, in an embodiment, any of the foregoing, including one or more users, user groups, transaction clusters, activities associated with one or more users, files, file permissions, system alerts, websites/domains, and the like.

With continuing reference to FIG. 2, an entity may be associated with a unique power of the number two (step 202). For example, six entities, labeled A, B, C, D, E, and F, may be associated with unique powers of two using the number two as the base and (n−1) as the exponent, or $2^{(n-1)}$, where n=1 to 6, in this example, but where n generally begins with the number one and increases until each entity is associated with a unique value. The value associated with each entity may be further converted to binary (step 204). Thus, where there are six entities, A through F, each entity may receive base 10 and binary values as follows:

A: $2^{(0)}=1=000001$
B: $2^{(1)}=2=000010$
C: $2^{(2)}=4=000100$
D: $2^{(3)}=8=001000$
E: $2^{(4)}=16=010000$
F: $2^{(5)}=32=100000$

Although a variety of mechanisms may be employed, in an embodiment, the relationships between each entity and its base 10 and/or binary value may be saved in a table, which may comprise a portion of a database (other mechanisms may include flat files, objects in an object oriented program, and the like). For example, database 106 may store these relationships as part of an entity cross-reference table, which is depicted in FIG. 3.

As stated, a collection may comprise a cluster/collection/group of one or more entities. Thus, where there are, for example, five collections, C1, C2, C3, C4, and C5, each collection may include entities as follows:

C1: A, B, C, D
C2: A, B, C
C3: A, B, E
C4: F
C5: A, B, C

Like each entity, each collection C1-C5 may be associated with a base 10 and/or binary value. This may be accomplished by summing the base 10 values of each unique entity in a collection and converting those values to binary. In an embodiment, the binary values associated with each unique entity in a collection may be logically ORed to produce the same result (step 206). In the example above, the following results are obtained:

C1: A+B+C+D=1+2+4+8=15=001111
C2: A+B+C=1+2+4=7=000111
C3: A+B+E=1+2+16=19=010011
C4: F=32=100000
C5: A+B+C=1+2+4=7=000111

As described above with reference to each entity value, each collection value may be stored in a database (e.g., database 106) as part of a collections table, which is depicted in FIG. 4.

At this point, in one embodiment, 512 unique entities (to pick a number solely for purposes of illustration) may be mapped uniquely using 512 bits, or 64 bytes. Assuming a period of 30 days at a rate of 500 entities per day per collection (e.g., a user collection performing up to 500 distinct transactions per day) and 20,000 collections, only about 38 megabytes of storage are required to store all of the data generated for the entire month. Thus, the data is compressed, in that a fraction of the storage previously required to track a collection's entities is required by the systems and methods described herein. Moreover, the data is stored losslessly, because all of the information associated with a collection's entities is stored intact as set of binary values.

The unique numbering system described above gives rise to a variety of unique and useful results (step 208). For instance, if a collection has a same entity sum as another collection, those collections are identical. That is, observe that collections C2 and C5, which both comprise entities A, B, and C, are associated with a base 10 sum of 7, or a binary sum of 000111. Thus, a simple numerical comparison shows duplicate collections. Further, because computing devices are designed to process data in a binary format (as opposed to a character or character string format, or even a base 10 format), the comparison described above may be performed at very high speed. That is, no computationally intensive string matching is required with the disclosed system.

Observe further that any collection that is associated with a value of $2^{(n-1)}$ necessarily includes only a single entity (e.g., a collection associated with a value of 1, 2, 4, 8 . . . only includes the entity associated with that value). On the other hand, any collection that is not associated with a value of $2^{(n-1)}$ is not limited to a single entity, and may include entities in common with other collections. For example, with reference to collections C1 and C3, system 100 may use a logical AND operation to quickly determine that these collections share entities in common and, indeed, which entities are shared. The calculation is provided below:

001111(C1) AND 010011(C3)=000011(Result)

Having reached this Result, system 100 may use the entity cross-reference table (depicted in FIG. 3) to determine that the Result contains entities A and B (as stated, A=000001 and B=000010). Thus, system 100 may quickly determine which entities a plurality of collections share in common. In addition, system 100 may associate an entity count with a plurality of collections, whereby system 100 may determine collections that are candidates for entity reduction/consolidation and/or likely include entities included in other collections. That is, collections with a high entity count may be more likely to share common entities.

From a practical standpoint, although many uses are possible, assume that a first and second collection comprise two different network user groups (e.g., group C1 and group C2). Assume further that these groups comprise a variety of network users (e.g., users A, B, and C). More particularly, assume:

Group C1: user A, user B, user C
Group C2: user A, user B

System 100 may determine, based upon the processes described above, that Groups C1 and C2 both include users A and B. A system or network administrator may use this information to collapse/remove/delete group C2, particularly where the administrator is able to place user C in a different group (not shown). Thus, the disclosed system and method may, in an example, permit a system or network administrator to remove redundant or unnecessary user groups.

With further regard to the manner in which entities are assigned a value, the speed at which system 100 operates may be further improved by calculating, prior to assigning each entity in a collection a value, the relative frequencies of each entity across a plurality of collections. Those entities that occur most commonly may be assigned lower values (e.g., 1 or 000001), while those entities that occur less commonly may be assigned higher values (e.g., 32 or 100000). In this way, long binary representations can be partitioned into subsets that enable faster logical operations. For example, using the 512 entity example above, frequent entities are placed in the low order bytes (i.e., to the right). Searching (or updating) the collections for a given common entity can be completed by performing the logical AND (respectively OR) on only the right most bytes and not the full 64 byte blocks. In an embodiment, the binary encoding can be completed so that similar or related entities are "close" together in the binary representation. This too enables partitioning the binary representation for efficient searching and/or updates of similar or related entities. Further efficiencies can be achieved in the embodiment, reference FIG. 4, by including a field for the number of entities in the collection or several fields for the number of entities in each of the partitioned subsets.

The foregoing process/tables/computations may be enhanced in a variety of ways. For instance, a collection table may be enhanced to show periodic (e.g., hourly, daily, weekly, monthly, 90 day, annual, etc.) entity sums, in which case a collection may be evaluated more granularly. This is depicted at FIG. 5. With respect to FIG. 5, note that Day_M is merely intended to represent the final day in a period of days. So, if the period is one month, M may equal 28, 29, 30, or 31, depending upon the month and year. Moreover, where a period is very granular (e.g., hourly) a trending analysis may be performed by system 100 to show a real time or pseudo-real time/quasi-real time behavior of one or more collections/entities.

In an embodiment, a collection table may include entries for entities "used" by a collection and entries for entities "assigned" to a collection. This enhancement may be helpful, in one example, to system administrators in determining whether a user collection is using all, fewer, or greater than the permissions entities that he is assigned. Table 6 shows this enhancement, and "used" and "assigned" may be merely illustrative and are not exclusive of other similar columns, such as "detected," for an alert or event, and "base events," where a collection comprises a group, such as a business unit within an organization.

Occasionally, it may be desirable to add granularity to the data stored for an entity.

That is, it may be useful to know/determine more than whether an entity occurred or exists. For example, where an entity comprises a file, the method described above may enable determination of whether the file was accessed. However, if it is important to know what type of access to which the file was subject (e.g., none, read, write, alter, control, update, etc.), additional tables are necessary. Hereinafter, this type of data (i.e., data about an entity other than whether the entity occurred or exists) is referred to as "level" data, or simply "levels," depending upon the context in which the terms appear. In certain embodiments, any number of levels may be associated with an entity, depending upon the nature of the entity (e.g., user entity, file entity, etc.) and the granularity and information desired.

With reference now to FIG. 7, a process 700 for associating level data with an entity is described. The process is similar to the process described above, with reference to FIG. 2. Specifically, each desired level must be associated with a unique value (step 702). The unique value may comprise a base 10 number, a binary number, a character or character string, and/or any combination thereof. (Note that in cases with large numbers of levels one may want to avoid using character or character strings for performance reasons.) For example, where an entity comprises a file or file access attempt (and the collection is a user), the file or file access attempt may be associated with a level depending upon the result of the access attempt. Potential levels include none, read, write, update, alter, control, and execute. The levels can be used to distinguish between read attempted and read granted, read attempted and read denied, write attempted and write granted, write granted and write denied, and the like. Potential unique values for each level include, R (read), W (write), U (update), A (alter), 1 (read), 2 (write), 3 (update), 4 (alter). In an embodiment, encoding can be completed to capture attempted and granted access, such as RR or 11 or 1 (read attempted and read granted), RD or 10 or 0 (read attempted and read denied), WW or 22, or 2 (write attempted and write granted), WD or 20 or 3 (write attempted and write denied), etc. In certain embodiments, any value/string/combination thereof may be assigned to a level or the combination of attempted versus granted, etc. The only requirement is that each level be assigned a unique identifier. As described above with reference to the entity cross-reference table (see FIG. 3), so too, the level data associated with each entity may be stored in a level cross-reference table. Exemplary level cross-reference tables are depicted at FIGS. 8A and 8B.

With further reference to FIG. 7, in order to capture level data associated with an entity (e.g., in order to capture the results of a file access attempt), each entity in a collection may be associated with an appropriate level, based upon the data contained in the level cross-reference table (step 704). This may be achieved by creating an array of level data, where the $n^{th}$ array element for the level is associated with the $n^{th}$ bit position for the entity in the binary representation for the entities in the associated collection. The following example, which uses entities A, C, and D, as above with reference to FIG. 2, is illustrative.

Entities:
A: 000001
C: 000100
D: 001000
Collection 1:
A, C, D: 001101
Level Data for Entities A, C, and D:
A: 2
C: 5
D: 3
Level Data Array for Collection 1:
0|0|3|5|0|2

Thus, the level data for each entity A, C, and D in Collection 1 is stored in a level data array, where the array position corresponds to the bit position of the entity in Collection 1 with which it is associated. In certain embodiments, vertical bars may be used herein to separate level data elements in a level data array to depict the array nature of a level data array. However, in practice, a level data array may not include vertical bars. One or more level data arrays may be stored in a level data collections table, an example of which is depicted at FIG. 9. Each level data array comprising a level data collections table may, in conjunction with a level data cross-reference table, permit a variety of more advanced analyses (step 706). For example, where a collection, C1, comprises a file, and the entities assigned to C1 comprise users A, B, and C attempting to access the file, system 100 may use the process described with reference to FIG. 2 to determine that users A, B, and C accessed (or attempted to access) the file collection, and the process described with reference to FIG. 7 to determine specific details about the access attempts by users A, B, and C (e.g. read attempted, read granted, etc.)

A level data collections table may be enhanced in a variety of ways. For instance, a level data collection table may be enhanced to show periodic (e.g., hourly, daily, weekly, monthly, 90 day, annual, etc.) level data for the associated collection, which enables evaluation with more granularity. An enhanced monthly level data collections table is depicted at FIG. 10. With reference to FIG. 10, note that Day_M is merely intended to represent the final day in a period of days. So, if the period is one month, M may equal 28, 29, 30, or 31, depending upon the month and/or year. Moreover, where a period is very granular (e.g., hourly) a trending analysis may be performed by system 100 to show a real time or pseudo-real time/quasi-real time behavior of one or more collections/entities. Further still, a Boolean flag may indicate whether an entity has been active (e.g., existed/occurred) during an interval (e.g., the last 30, 60, 90, etc. days).

A level data collections table may be further enhanced to provide a minimum or maximum array level for each associated entity for a given collection during a given period. For example, a level data collections table may include a maximum level associated with one or more collections during a given month. An exemplary summary level data collections table including this data is depicted at FIG. 11. Again, a Boolean flag may indicate whether an entity has been active (e.g., existed/occurred) during an interval (e.g., the last 30, 60, 90, etc. days).

In addition to providing details about an entity, level data may be leveraged to assess the risk associated with a particular entity. For example, where an entity comprises a file, and the collection associated with the entity comprises a user, level data may be leveraged to determine the risk associated with the user's file access attempts. That is, where a user attempts to access a file and access is denied (because the user does not have permission to access the file), a higher risk may be associated with the user or the user's activities. This risk may be associated with a risk level, which may be defined in any suitable manner. For example, a risk may be assigned a risk level of 1 to 10, 0 to 9, low, medium, high, etc., depending upon a variety of factors (e.g., likelihood of harm, impact of harm, etc.) This data may be stored in a risk level cross-reference table. An exemplary risk level cross-reference table is depicted at FIG. 12. Further, a risk level may be stored and associated with an entity and/or a collection in the manner described above with reference to level data. That is, each entity in a collection may be associated with a risk level by storing a risk level in a risk level collections table in the array position corresponding to the bit position of the entity in the collection with which it is associated. An exemplary risk level collections table is depicted at FIG. 13.

Further still, one or more fields/columns/tables may be implemented to capture the number of transactions associated with each risk level (on an entity/collection/system wide level), and this data may, for instance and in the example provided above, form the basis for a report highlighting excess user access or attempted access violations. For example, and with reference to FIG. 14, which depicts an exemplary monthly risk level transaction count table, the $n^{th}$ array element may hold a count for the number of times that the $n^{th}$ associated entity in the collection (e.g., activity, transaction type or resource) has been attempted to be performed/occurred/accessed. During multiple events for accessing or attempting to access a resource, transaction, system, etc., the level array may simply capture the maximum access attempted. This may ensure that the worst case (i.e., the maximum level) is identified. For example, if a user is granted ALTER accesses to a particular file and then accesses it 99 times with READ access and once with WRITE or ALTER access then the level entry in the associated array may show ALTER ATTEMPTED and ALTER GRANTED, e.g., 22, while the associated count in the risk level transaction count table (FIG. 14) would be 100. Additionally, the array elements may be broken down into separate bit maps, where there may be an indicator for the various levels and the associated counts. For example, a 64 bit array element may be used to allocate bits for different levels, with either assumed (based on position) or explicit level identifiers. Counts that exceed the maximum value may simply be left at their maximum value and not rolled to restart counting from zero.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to impact such feature, structure, or characteristic in connection with other embodiments whether or not explicitly described. After reading the description, it will be apparent to one skilled in the relevant art(s) how to implement the disclosure in certain embodiments.

In various embodiments, the methods described herein are implemented using the various particular machines described herein. The methods described herein may be implemented using the particular machines, and those hereinafter developed, in any suitable combination, as would be appreciated immediately by one skilled in the art. Further, as is unambiguous from this disclosure, the methods described herein may result in various transformations of certain articles.

For the sake of brevity, conventional data networking, application development and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical system.

The various system components discussed herein may include one or more of the following: a host server or other computing systems including a processor for processing digital data; a memory coupled to the processor for storing digital data; an input digitizer coupled to the processor for inputting digital data; an application program stored in the memory and accessible by the processor for directing processing of digital data by the processor; a display device coupled to the processor and memory for displaying information derived from digital data processed by the processor; and a plurality of databases. Various databases used herein may include: client data; merchant data; financial institution data; and/or like data useful in the operation of the system. As those skilled in the art will appreciate, user computer may include an operating system (e.g., Windows NT, 95/98/2000, XP, Vista, OS2, UNIX, Linux, Solaris, MacOS, etc.) as well as various conventional support software and drivers typically associated with computers. A user may include any individual, business, entity, government organization, software and/or hardware that interact with a system.

In an embodiment, various components, modules, and/or engines of system 100 may be implemented as micro-applications or micro-apps. Micro-apps are typically deployed in the context of a mobile operating system, including for example, a Palm mobile operating system, a Windows mobile operating system, an Android Operating System, Apple iOS, a Blackberry operating system and the like. The micro-app may be configured to leverage the resources of the larger operating system and associated hardware via a set of predetermined rules which govern the operations of various operating systems and hardware resources. For example, where a micro-app desires to communicate with a device or network other than the mobile device or mobile operating system, the micro-app may leverage the communication protocol of the operating system and associated device hardware under the predetermined rules of the mobile operating system. Moreover, where the micro-app desires an input from a user, the micro-app may be configured to request a response from the operating system which monitors various hardware components and then communicates a detected input from the hardware to the micro-app.

The system contemplates uses in association with web services, utility computing, pervasive and individualized computing, security and identity solutions, autonomic computing, cloud computing, commodity computing, mobility and wireless solutions, open source, biometrics, grid computing and/or mesh computing.

Any databases discussed herein may include relational, hierarchical, graphical, or object-oriented structure and/or any other database configurations. Common database products that may be used to implement the databases include DB2 by IBM (Armonk, N.Y.), various database products available from Oracle Corporation (Redwood Shores, Calif.), Microsoft Access or Microsoft SQL Server by Microsoft Corporation (Redmond, Wash.), MySQL by MySQL AB (Uppsala, Sweden), or any other suitable database product. Moreover, the databases may be organized in any suitable manner, for example, as data tables or lookup tables. Each record may be a single file, a series of files, a linked series of data fields or any other data structure. Association of certain data may be accomplished through any desired data association technique such as those known or practiced in the art. For example, the association may be accomplished either manually or automatically. Automatic association techniques may include, for example, a database search, a database merge, GREP, AGREP, SQL, using a key field in the tables to speed searches, sequential searches through all the tables and files, sorting records in the file according to a known order to simplify lookup, and/or the like. The association step may be accomplished by a database merge function, for example, using a "key field" in pre-selected databases or data sectors. Various database tuning steps are contemplated to optimize database performance. For example, frequently used files such as indexes may be placed on separate file systems to reduce In/Out ("I/O") bottlenecks.

More particularly, a "key field" partitions the database according to the high-level class of objects defined by the key field. For example, certain types of data may be designated as a key field in a plurality of related data tables and the data tables may then be linked on the basis of the type of data in the key field. The data corresponding to the key field in each of the linked data tables is preferably the same or of the same type. However, data tables having similar, though not identical, data in the key fields may also be linked by using AGREP, for example. In accordance with one embodiment, any suitable data storage technique may be utilized to store data without a standard format. Data sets may be stored using any suitable technique, including, for example, storing individual files using an ISO/IEC 7816-4 file structure; implementing a domain whereby a dedicated file is selected that exposes one or more elementary files containing one or more data sets; using data sets stored in individual files using a hierarchical filing system; data sets stored as records in a single file (including compression, SQL accessible, hashed via one or more keys, numeric, alphabetical by first tuple, etc.); Binary Large Object (BLOB); stored as ungrouped data elements encoded using ISO/IEC 7816-6 data elements; stored as ungrouped data elements encoded using ISO/IEC Abstract Syntax Notation (ASN.1) as in ISO/IEC 8824 and 8825; and/or other proprietary techniques that may include fractal compression methods, image compression methods, etc.

In one exemplary embodiment, the ability to store a wide variety of information in different formats is facilitated by storing the information as a BLOB. Thus, any binary information can be stored in a storage space associated with a data set. As discussed above, the binary information may be stored on the financial transaction instrument or external to but affiliated with the financial transaction instrument. The BLOB method may store data sets as ungrouped data elements formatted as a block of binary via a fixed memory offset using either fixed storage allocation, circular queue techniques, or best practices with respect to memory management (e.g., paged memory, least recently used, etc.). By using BLOB methods, the ability to store various data sets that have different formats facilitates the storage of data associated with the financial transaction instrument by multiple and unrelated owners of the data sets. For example, a first data set which may be stored may be provided by a first party, a second data set which may be stored may be provided by an unrelated second party, and yet a third data set which may be stored, may be provided by an third party unrelated to the first and second party. Each of these three exemplary data sets may contain different information that is stored using different data storage formats and/or techniques. Further, each data set may contain subsets of data that also may be distinct from other subsets.

As stated above, in various embodiments, the data can be stored without regard to a common format. However, in one exemplary embodiment, the data set (e.g., BLOB) may be annotated in a standard manner when provided for manipulating the data onto the financial transaction instrument. The annotation may comprise a short header, trailer, or other appropriate indicator related to each data set that is configured to convey information useful in managing the various data sets. For example, the annotation may be called a "condition header", "header", "trailer", or "status", herein, and may comprise an indication of the status of the data set or may include an identifier correlated to a specific issuer or owner of the data. In one example, the first three bytes of each data set BLOB may be configured or configurable to indicate the status of that particular data set; e.g., LOADED, INITIALIZED, READY, BLOCKED, REMOVABLE, or DELETED. Subsequent bytes of data may be used to indicate for example, the identity of the issuer, user, transaction/membership account identifier or the like. Each of these condition annotations are further discussed herein.

The data set annotation may also be used for other types of status information as well as various other purposes. For example, the data set annotation may include security information establishing access levels. The access levels may, for example, be configured to permit only certain individuals, levels of employees, companies, or other entities to access data sets, or to permit access to specific data sets based on the transaction, merchant, issuer, user or the like. Furthermore, the security information may restrict/permit only certain actions such as accessing, modifying, and/or deleting data sets. In one example, the data set annotation indicates that only the data set owner or the user are permitted to delete a data set, various identified users may be permitted to access the data set for reading, and others are altogether excluded from accessing the data set. However, other access restriction parameters may also be used allowing various entities to access a data set with various permission levels as appropriate.

The data, including the header or trailer may be received by a stand alone interaction device configured to add, delete, modify, or augment the data in accordance with the header or trailer. As such, in one embodiment, the header or trailer is not stored on the transaction device along with the associated issuer-owned data but instead the appropriate action may be taken by providing to the transaction instrument user at the stand alone device, the appropriate option for the action to be taken. The system may contemplate a data storage arrangement wherein the header or trailer, or header or trailer history, of the data is stored on the transaction instrument in relation to the appropriate data.

One skilled in the art will also appreciate that, for security reasons, any databases, systems, devices, servers or other components of the system may consist of any combination thereof at a single location or at multiple locations, wherein each database or system includes any of various suitable security features, such as firewalls, access codes, encryption, decryption, compression, decompression, and/or the like.

Encryption may be performed by way of any of the techniques now available in the art or which may become available—e.g., Twofish, RSA, El Gamal, Schorr signature, DSA, PGP, PKI, and symmetric and asymmetric cryptosystems.

The computers discussed herein may provide a suitable website or other Internet-based graphical user interface which is accessible by users. In one embodiment, the Microsoft Internet Information Server (IIS), Microsoft Transaction Server (MTS), and Microsoft SQL Server, are used in conjunction with the Microsoft operating system, Microsoft NT web server software, a Microsoft SQL Server database system, and a Microsoft Commerce Server. Additionally, components such as Access or Microsoft SQL Server, Oracle, Sybase, Informix MySQL, Interbase, etc., may be used to provide an Active Data Object (ADO) compliant database management system. In one embodiment, the Apache web server is used in conjunction with a Linux operating system, a MySQL database, and the Perl, PHP, and/or Python programming languages.

Any of the communications, inputs, storage, databases or displays discussed herein may be facilitated through a website having web pages. The term "web page" as it is used herein is not meant to limit the type of documents and applications that might be used to interact with the user. For example, a typical website might include, in addition to standard HTML documents, various forms, Java applets, JavaScript, active server pages (ASP), common gateway interface scripts (CGI), extensible markup language (XML), dynamic HTML, cascading style sheets (CSS), AJAX (Asynchronous Javascript And XML), helper applications, plug-ins, and the like. A server may include a web service that receives a request from a web server, the request including a URL (http://yahoo.com/stockquotes/ge) and an IP address (123.56.789.234). The web server retrieves the appropriate web pages and sends the data or applications for the web pages to the IP address. Web services are applications that are capable of interacting with other applications over a communications means, such as the interne. Web services are typically based on standards or protocols such as XML, SOAP, AJAX, WSDL and UDDI. Web services methods are well known in the art, and are covered in many standard texts. See, e.g., ALEX NGHIEM, IT WEB SERVICES: A ROADMAP FOR THE ENTERPRISE (2003), hereby incorporated by reference.

Middleware may include any hardware and/or software suitably configured to facilitate communications and/or process transactions between disparate computing systems. Middleware components are commercially available and known in the art. Middleware may be implemented through commercially available hardware and/or software, through custom hardware and/or software components, or through a combination thereof. Middleware may reside in a variety of configurations and may exist as a standalone system or may be a software component residing on the Internet server. Middleware may be configured to process transactions between the various components of an application server and any number of internal or external systems for any of the purposes disclosed herein. WebSphere MQ™ (formerly MQSeries) by IBM, Inc. (Armonk, N.Y.) is an example of a commercially available middleware product. An Enterprise Service Bus ("ESB") application is another example of middleware.

Practitioners will also appreciate that there are a number of methods for displaying data within a browser-based document. Data may be represented as standard text or within a fixed list, scrollable list, drop-down list, editable text field, fixed text field, pop-up window, and the like. Likewise, there are a number of methods available for modifying data in a web page such as, for example, free text entry using a keyboard, selection of menu items, check boxes, option boxes, and the like.

The system and method may be described herein in terms of functional block components, screen shots, optional selections and various processing steps. It should be appreciated that such functional blocks may be realized by any number of hardware and/or software components configured to perform the specified functions. For example, the system may employ various integrated circuit components, e.g., memory elements, processing elements, logic elements, look-up tables, and the like, which may carry out a variety of functions under the control of one or more microprocessors or other control devices. Similarly, the software elements of the system may be implemented with any programming or scripting language such as C, C++, C#, Java, JavaScript, VBScript, Macromedia Cold Fusion, COBOL, Microsoft Active Server Pages, assembly, PERL, PHP, awk, Python, Visual Basic, SQL Stored Procedures, PL/SQL, any UNIX shell script, and extensible markup language (XML) with the various algorithms being implemented with any combination of data structures, objects, processes, routines or other programming elements. Further, it should be noted that the system may employ any number of conventional techniques for data transmission, signaling, data processing, network control, and the like. Still further, the system could be used to detect or prevent security issues with a client-side scripting language, such as JavaScript, VBScript or the like. For a basic introduction of cryptography and network security, see any of the following references: (1) "Applied Cryptography: Protocols, Algorithms, And Source Code In C," by Bruce Schneier, published by John Wiley & Sons (second edition, 1995); (2) "Java Cryptography" by Jonathan Knudson, published by O'Reilly & Associates (1998); (3) "Cryptography & Network Security: Principles & Practice" by William Stallings, published by Prentice Hall; all of which are hereby incorporated by reference.

As used herein, the term "end user", "consumer", "customer", "cardmember", "business" or "merchant" may be used interchangeably with each other, and each shall mean any person, entity, machine, hardware, software or business. A bank may be part of the system, but the bank may represent other types of card issuing institutions, such as credit card companies, card sponsoring companies, or third party issuers under contract with financial institutions. It is further noted that other participants may be involved in some phases of the transaction, such as an intermediary settlement institution, but these participants are not shown.

Each participant is equipped with a computing device in order to interact with the system and facilitate online commerce transactions. The customer has a computing unit in the form of a personal computer, although other types of computing units may be used including laptops, notebooks, hand held computers, set-top boxes, cellular telephones, touch-tone telephones and the like. The merchant has a computing unit implemented in the form of a computer-server, although other implementations are contemplated by the system. The bank has a computing center shown as a main frame computer. However, the bank computing center may be implemented in other forms, such as a mini-computer, a PC server, a network of computers located in the same or different geographic locations, or the like. Moreover, the system contemplates the use, sale or distribution of any goods, services or information over any network having similar functionality described herein.

The merchant computer and the bank computer may be interconnected via a second network, referred to as a payment network. The payment network which may be part of certain transactions represents existing proprietary networks that presently accommodate transactions for credit cards, debit cards, and other types of financial/banking cards. The payment network is a closed network that is assumed to be secure from eavesdroppers. Exemplary transaction networks may include the American Express®, VisaNet® and the Veriphone® networks.

The electronic commerce system may be implemented at the customer and issuing bank. In an exemplary implementation, the electronic commerce system is implemented as computer software modules loaded onto the customer computer and the banking computing center. The merchant computer does not require any additional software to participate in the online commerce transactions supported by the online commerce system.

As will be appreciated by one of ordinary skill in the art, the system may be embodied as a customization of an existing system, an add-on product, upgraded software, a stand alone system, a distributed system, a method, a data processing system, a device for data processing, and/or a computer program product. Accordingly, the system may take the form of an entirely software embodiment, an entirely hardware embodiment, or an embodiment combining aspects of both software and hardware. Furthermore, the system may take the form of a computer program product on a computer-readable storage medium having computer-readable program code means embodied in the storage medium. Any suitable computer-readable storage medium may be utilized, including hard disks, CD-ROM, optical storage devices, magnetic storage devices, and/or the like.

The system and method is described herein with reference to screen shots, block diagrams and flowchart illustrations of methods, apparatus (e.g., systems), and computer program products according to various embodiments. It will be understood that each functional block of the block diagrams and the flowchart illustrations, and combinations of functional blocks in the block diagrams and flowchart illustrations, respectively, can be implemented by computer program instructions.

These computer program instructions may be loaded onto a general purpose computer, special purpose computer, or other programmable data processing apparatus to produce a machine, such that the instructions that execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

Accordingly, functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions. Further, illustrations of the process flows and the descriptions thereof may make reference to user windows, webpages, websites, web forms, prompts, etc. Practitioners will appreciate that the illustrated steps described herein may comprise in any number of configurations including the use of windows, webpages, web forms, popup windows, prompts and the like. It should be further appreciated that the multiple steps as illustrated and described may be combined into single webpages and/or windows but have been expanded for the sake of simplicity. In other cases, steps illustrated and described as single process steps may be separated into multiple webpages and/or windows but have been combined for simplicity.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." Moreover, where a phrase similar to 'at least one of A, B, and C' or 'at least one of A, B, or C' is used in the claims or specification, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, the term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" should be construed to exclude only those types of transitory computer-readable media which were found in *In Re Nuijten* to fall outside the scope of patentable subject matter under 35 U.S.C. §101.

Although the disclosure includes a method in certain embodiments, it is contemplated that it may be embodied as computer program instructions on a tangible computer-readable carrier, such as a magnetic or optical memory or a magnetic or optical disk. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising:
    associating, by a computer-based system for compression, one or more of a plurality of unique entities with one or more of a plurality of unique binary numbers, wherein a unique binary number corresponds to a base 10 value of the form $2^{(n-1)}$, and wherein the associating further comprises associating, by the computer-based system, a most frequently occurring entity with a binary number corresponding to a base 10 value of $2^0$, and associating, by the computer-based system and based upon a frequency of occurrence, less frequently occurring entities with binary numbers corresponding to increasing powers of the number two;
    associating, by the computer-based system, a collection with the plurality of unique entities; and
    determining, by the computer-based system, that the collection includes one of the plurality of unique entities based upon the unique binary number associated with the unique entity.

2. The method of claim 1, wherein the associating the collection with the plurality of unique entities further comprises summing, by the computer-based system, the unique binary numbers associated with the plurality of unique entities.

3. The method of claim 1, wherein the associating the collection with the plurality of unique entities further comprises associating, by the computer-based system, the collection with a binary number that is a logical result of a bitwise operation between the unique binary numbers associated with the plurality of unique entities.

4. The method of claim 1, wherein the determining further comprises comparing, by the computer-based system using a bitwise operator, a first binary number associated with a first collection to a second binary number associated with a second collection.

5. The method of claim 1, wherein the determining further comprises comparing, by the computer-based system, a binary number associated with the collection to at least one of the plurality of unique binary numbers associated with the plurality of entities.

6. The method of claim 1, further comprising associating, by the computer-based system, level data with the plurality of unique entities.

7. The method of claim 1, further comprising associating, by the computer-based system, a level with at least one of the plurality of unique entities in the collection.

8. The method of claim 1, further comprising performing, by the computer-based system, a pseudo-real time trending analysis based upon at least one of the plurality of unique entities associated with the collection and level data associated the at least one of the plurality of unique entities associated with the collection.

9. The method of claim 1, further comprising performing, by the computer-based system, a pseudo-real time trending analysis based upon at least one of the plurality of unique entities associated with the collection.

10. The method of claim 1, further comprising:
    determining, by the computer-based system, that the collection includes an entity that is included in another collection, and relocating, by the computer-based system, the entity from the collection to the another collection based upon the determining.

11. A system comprising:
a tangible, non-transitory memory communicating with a processor for compression,
the tangible, non-transitory memory having instructions stored thereon that, in response to execution by the processor, cause the processor to perform operations comprising:
associating, by the processor, one or more of a plurality of unique entities with one or more of a plurality of unique binary numbers, wherein a unique binary number corresponds to a base 10 value of the form $2^{(n-1)}$, and wherein the associating further comprises associating, by the computer-based system, a most frequently occurring entity with a binary number corresponding to a base 10 value of $2^0$, and associating, by the computer-based system and based upon a frequency of occurrence, less frequently occurring entities with binary numbers corresponding to increasing powers of the number two;
associating, by the processor, a collection with the plurality of unique entities; and
determining, by the processor, that the collection includes one of the plurality of unique entities based upon the unique binary number associated with the unique entity.

12. The system of claim 11, wherein the associating the collection with the plurality of unique entities further comprises associating, by the processor, the collection with a binary number that is a logical result of a bitwise operation between the unique binary numbers associated with the plurality of unique entities.

13. The system of claim 11, wherein the determining further comprises comparing, by the processor using a bitwise operator, a first binary number associated with a first collection to a second binary number associated with a second collection.

14. The system of claim 11, further comprising associating, by the computer-based system, a level with each of the unique entities in the collection.

15. An article of manufacture including a non-transitory, tangible computer readable medium having instructions stored thereon that, in response to execution by a computer-based system for compression, cause the computer-based system to perform operations comprising:
associating, by the computer-based system, one or more of a plurality of unique entities with one or more of a plurality of unique binary numbers, wherein a unique binary number corresponds to a base 10 value of the form $2^{(n-1)}$, and wherein the associating further comprises associating, by the computer-based system, a most frequently occurring entity with a binary number corresponding to a base 10 value of $2^0$, and associating, by the computer-based system and based upon a frequency of occurrence, less frequently occurring entities with binary numbers corresponding to increasing powers of the number two;
associating, by the computer-based system, a collection with the plurality of unique entities; and
determining, by the computer-based system, that the collection includes one of the plurality of unique entities based upon the unique binary number associated with the unique entity.

16. The article of claim 15, wherein the associating the collection with the plurality of unique entities further comprises associating, by the computer-based system, the collection with a binary number that is a logical result of a bitwise operation between the unique binary numbers associated with the plurality of unique entities.

17. The article of claim 15, wherein the determining further comprises comparing, by the computer-based system using a bitwise operator, a first binary number associated with a first collection to a second binary number associated with a second collection.

* * * * *